United States Patent
Sung et al.

(10) Patent No.: US 9,391,174 B1
(45) Date of Patent: Jul. 12, 2016

(54) METHOD OF UNIFORM FIN RECESSING USING ISOTROPIC ETCH

(71) Applicant: GLOBALFOUNDRIES Inc., Grand Cayman (KY)

(72) Inventors: Min Gyu Sung, Latham, NY (US); Ruilong Xie, Schenectady, NY (US); Chanro Park, Clifton Park, NY (US); Hoon Kim, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/730,735

(22) Filed: Jun. 4, 2015

(51) Int. Cl.
*H01L 29/66* (2006.01)
*H01L 21/306* (2006.01)
*H01L 21/31* (2006.01)
*H01L 21/311* (2006.01)

(52) U.S. Cl.
CPC .... *H01L 29/66795* (2013.01); *H01L 21/30604* (2013.01); *H01L 21/31* (2013.01); *H01L 21/31116* (2013.01)

(58) Field of Classification Search
CPC .............. H01L 21/30604; H01L 21/31; H01L 21/31116
See application file for complete search history.

(56) References Cited

U.S. PATENT DOCUMENTS

| 8,617,996 | B1 * | 12/2013 | Chi | H01L 21/30604 257/E21.377 |
|---|---|---|---|---|
| 2013/0309838 | A1 * | 11/2013 | Wei | H01L 21/76229 438/424 |
| 2014/0151766 | A1 * | 6/2014 | Eneman | H01L 29/1054 257/288 |
| 2014/0191323 | A1 * | 7/2014 | Bergendahl | H01L 21/823431 257/368 |
| 2015/0056815 | A1 * | 2/2015 | Fernandez | H01L 21/31056 438/712 |
| 2015/0279971 | A1 * | 10/2015 | Xie | H01L 29/785 257/401 |

* cited by examiner

*Primary Examiner* — Mamadou Diallo
(74) *Attorney, Agent, or Firm* — Wayne F. Reinke, Esq.; Heslin Rothenberg Farley & Mesiti P.C.

(57) ABSTRACT

Uniform fin recessing for the situation of recessing nonadjacent fins and the situation of recessing adjacent fins includes providing a starting semiconductor structure, the structure including a semiconductor substrate, multiple fins coupled to the substrate, each fin having a hard mask layer thereover and being surrounded by isolation material. The hard mask layer is then removed over some of the fins, at least partially removing the some of the raised structures, the at least partially removing creating openings, and filling the openings with an optical planarization layer (OPL) material.

14 Claims, 5 Drawing Sheets

METHOD OF UNIFORM FIN RECESSING USING ISOTROPIC ETCH

BACKGROUND OF THE INVENTION

1. Technical Field

The present invention generally relates to semiconductor device fabrication. More particularly, the present invention relates to achieving uniform fin recessing in the situations of recessing nonadjacent fins and recessing adjacent fins.

2. Background Information

As semiconductor devices continue to shrink, new fabrication processes and techniques are needed. For example, below about a 30 nm fin pitch, an anisotropic fin recess will leave partial fins (or fin "spikes") behind. One attempted solution has been to instead use an isotropic (or "dry") fin recess. However, doing so results in nonuniform recess depths for the situation of nonadjacent fins being recessed (fins only partially recessed, due to the loading effect), and the situation of adjacent fins being recessed.

Thus, a need continues to exist for a way to achieve uniform fin recess for both nonadjacent fin recess and adjacent fin recess.

SUMMARY OF THE INVENTION

The shortcomings of the prior art are overcome and additional advantages are provided through the provision, in one aspect, of a method of uniform recessing of semiconductor structures raised with respect to the substrate (e.g., fins). The method includes providing a starting semiconductor structure, the structure including a semiconductor substrate, a plurality of raised semiconductor structures coupled to the substrate, each raised structure having a hard mask layer thereover and being surrounded by isolation material. The method further includes removing the hard mask layer over some of the raised structures, at least partially removing the some of the raised structures, the at least partially removing creating openings, and filling the openings with an optical planarization layer (OPL) material.

In accordance with another aspect, a method is provided. The method includes providing a starting semiconductor structure, the structure including a semiconductor substrate, a plurality of raised semiconductor structures coupled to the substrate, each raised structure having a hard mask layer thereover and being surrounded by isolation material. The method further includes removing the hard mask layer over at least two nonadjacent raised structures, and partially removing the at least two nonadjacent raised structures, the partially removing creating openings. The method further includes filling the openings with an optical planarization layer (OPL) material and creating a layer of the OPL material over the structure, removing at least a portion of the OPL material, and removing any remaining portions of the at least two nonadjacent raised structures and the OPL material.

In accordance with yet another aspect, a method is provided. The method includes providing a starting semiconductor structure, the structure including a semiconductor substrate, a plurality of raised semiconductor structures coupled to the substrate, each raised structure having a hard mask layer thereover and being surrounded by isolation material. The method further includes removing the hard mask layer over at least two adjacent raised structures, and fully removing the at least two adjacent raised structures, the fully removing creating openings. The method further includes filling the openings with an optical planarization layer (OPL) material and creating a layer of the OPL material over the structure, removing at least a portion of the OPL material, and removing any remaining portions of the at least two adjacent raised structures and the OPL material.

These, and other objects, features and advantages of this invention will become apparent from the following detailed description of the various aspects of the invention taken in conjunction with the accompanying drawings.

DETAILED DESCRIPTION OF THE INVENTION

Figure 1:
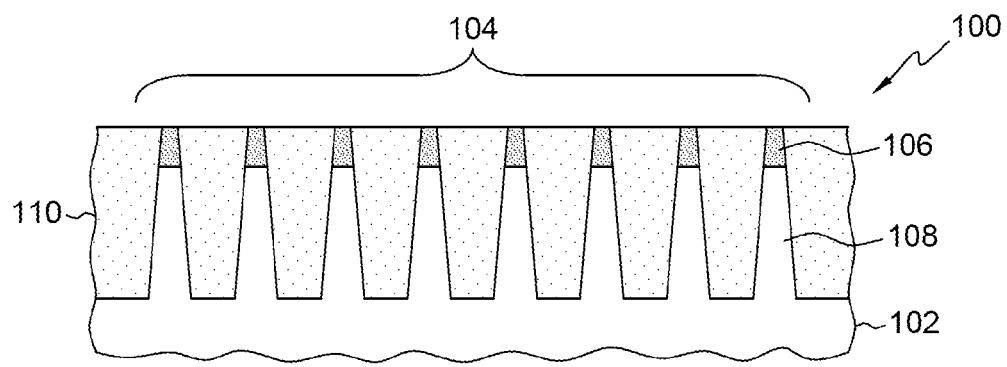
FIG. 1 is a cross-sectional view of one example of a starting three-dimensional semiconductor structure, the structure including a semiconductor substrate, multiple raised semiconductor structures (e.g., "fins") coupled to the substrate, each raised structure having a hard mask layer thereover and being surrounded by isolation material, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting three-dimensional semiconductor structure 100, the structure including a semiconductor substrate 102, multiple raised semiconductor structures 104 coupled to the substrate, each raised structure having a hard mask layer thereover (e.g., hard mask layer 106 over raised structure 108) and being surrounded by isolation material 110, in accordance with one or more aspects of the present invention.

The starting structure may be conventionally fabricated, for example, using known processes and techniques. Although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The non-planar structure further includes multiple raised semiconductor structures 104 (raised with respect to the substrate). In one example, the raised structures take the form of "fins." The raised structure(s) may be etched from a bulk substrate, and may include, for example, any of the materials listed above with respect to the substrate. Further, some or all of the raised structure(s) may include added impurities (e.g., by doping), making them n-type or p-type.

Figure 2:
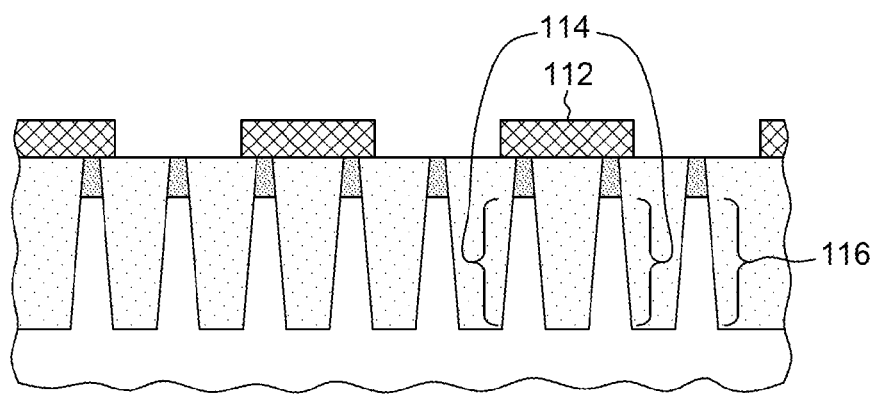
FIG. 2 depicts one example of the starting three-dimensional semiconductor structure of FIG. 1 with a layer of lithographic blocking material over pairs of adjacent raised structures, individual raised structures lacking the lithographic blocking layer and separating the pairs of adjacent raised structures, in accordance with one or more aspects of the present invention.

FIG. 2 depicts one example of the starting three-dimensional semiconductor structure of FIG. 1 with a layer 112 of lithographic blocking material over pairs of adjacent raised structures (e.g., raised structure pair 114), individual raised structures (e.g., raised structure 116) lacking the lithographic blocking layer and situated adjacent at least one pair of adjacent raised structures, in accordance with one or more aspects of the present invention.

Layer 112 may be, for example, conventionally fabricated and patterned to expose the individual raised structures intended to be recessed. It should be noted that FIG. 2 is simply one example of recessing a relatively small number of individual (i.e., nonadjacent) raised structures. For example, the repeating pattern shown of the two adjacent raised structures (covered by layer 112), then an exposed raised structure, could be different. There could be a single raised structure to be recessed, random raised structures recessed or any pattern.

Figure 3:
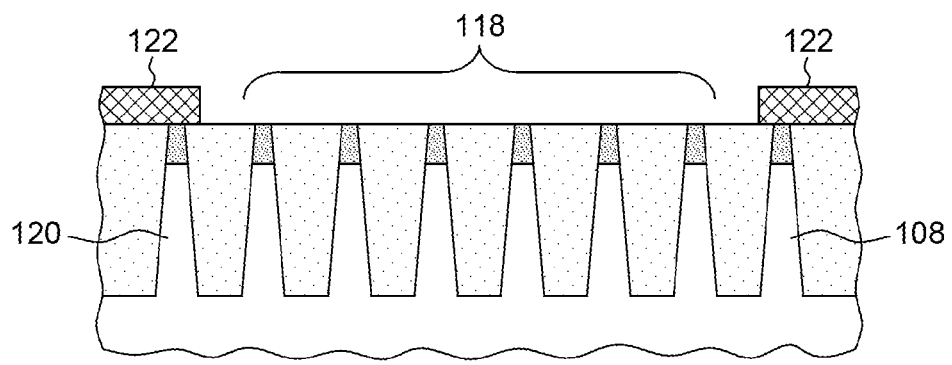
FIG. 3 depicts one example of the starting three-dimensional semiconductor structure of FIG. 1 with at least one group of adjacent raised structures exposed and a rest of the raised structures having a layer of lithographic blocking material thereover, in accordance with one or more aspects of the present invention.

FIG. 3 depicts one example of the starting three-dimensional semiconductor structure of FIG. 1 with at least one group 118 of adjacent raised structures exposed and a rest of the raised structures (e.g., raised structures 108 and 120)

having a layer 122 of lithographic blocking material thereover, in accordance with one or more aspects of the present invention.

FIGS. 2 and 3 represent examples of the two general cases of recessing individual raised structures (FIG. 2) and recessing a group of adjacent raised structures (FIG. 3).

Figure 4:
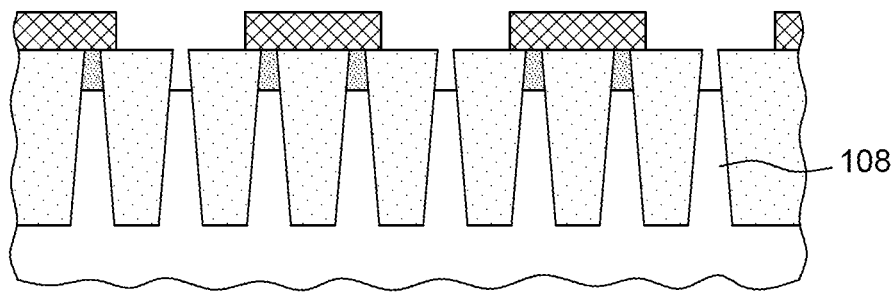
FIG. 4 depicts one example of the structure of FIG. 2 after removing the hard mask layer from the individual raised structures, in accordance with one or more aspects of the present invention.

FIG. 4 depicts one example of the structure of FIG. 2 after removing the hard mask layer (e.g., layer 106, FIG. 1) from the individual raised structure(s) (e.g., raised structure 108), in accordance with one or more aspects of the present invention.

Figure 5:
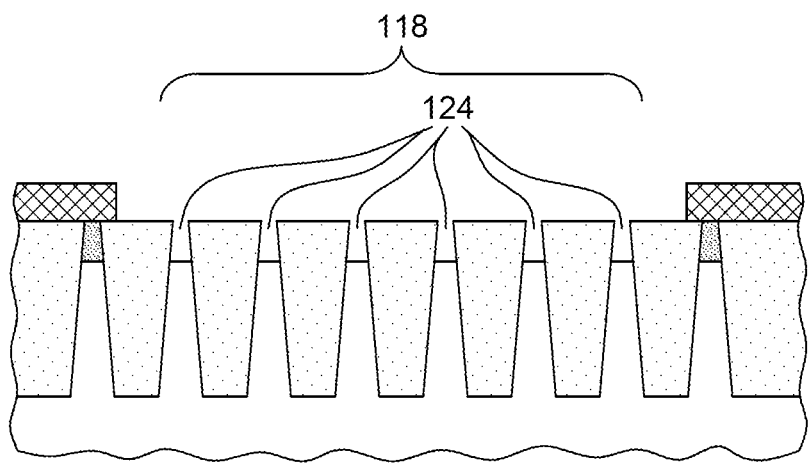
FIG. 5 depicts one example of the structure of FIG. 3 after removing the hard mask layer from the at least one group of adjacent raised structures, the removing exposing the raised structures, in accordance with one or more aspects of the present invention.

FIG. 5 depicts one example of the structure of FIG. 3 after removing the hard mask layer 124 from the at least one group 118 of adjacent raised structures, the removing exposing the raised structures, in accordance with one or more aspects of the present invention.

In one example, removing the hard mask layer(s) in either FIG. 4 or FIG. 5 may be accomplished using a selective etching process. In a more specific example, where the hard mask layer(s) include silicon nitride, the etching process may be a reactive ion etching process.

Figure 6:
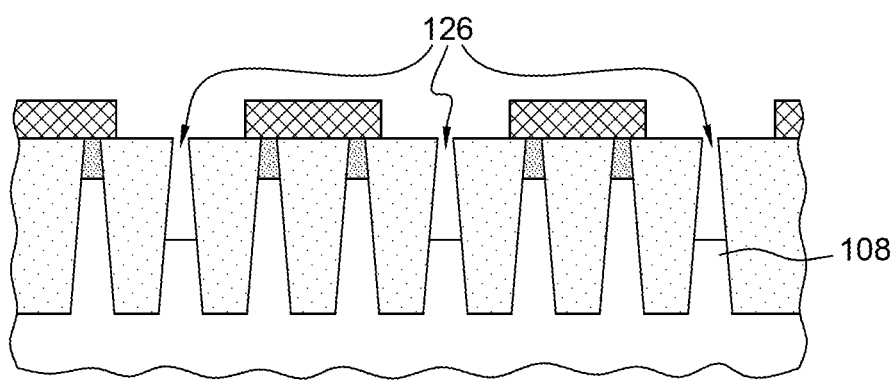
FIG. 6 depicts one example of the structure of FIG. 4 after partially removing the individual raised structures, the partially removing creating openings, in accordance with one or more aspects of the present invention.

FIG. 6 depicts one example of the structure of FIG. 4 after partially removing the individual raised structures (e.g., raised structure 108), the partially removing creating openings 126, in accordance with one or more aspects of the present invention.

Figure 7:
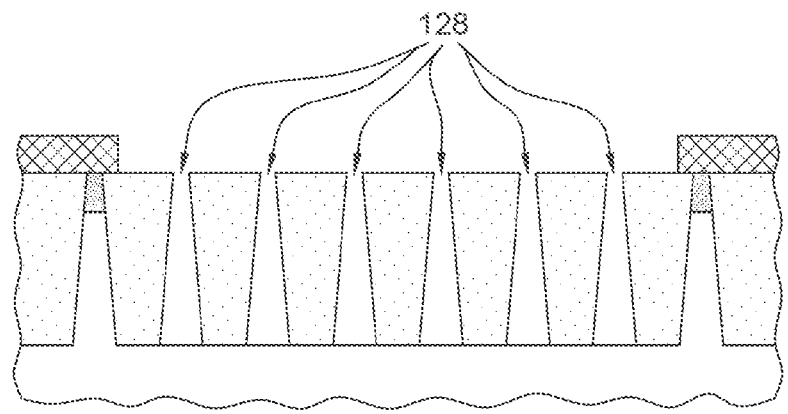
FIG. 7 depicts one example of the structure of FIG. 5 after fully removing the individual raised structures, the fully removing creating openings, in accordance with one or more aspects of the present invention.

FIG. 7 depicts one example of the structure of FIG. 5 after fully removing the individual raised structures (e.g., raised structure 108), the fully removing creating openings 128, in accordance with one or more aspects of the present invention.

In the case of either FIG. 6 or FIG. 7, removing the raised structures (partial or full) may be accomplished using, for example, an isotropic reactive ion etching process selective to the material of the raised structures (e.g., silicon).

Figure 8:
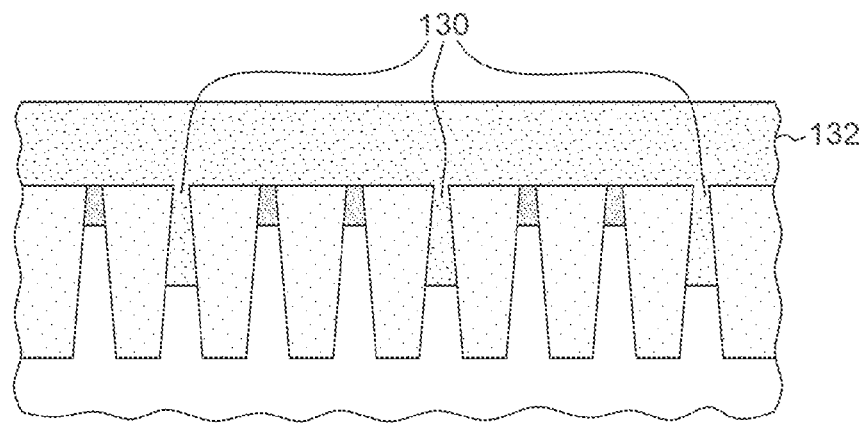
FIG. 8 depicts one example of the structure of FIG. 6 after filling the openings with an optical planarization layer (OPL) material and creating a layer of the OPL material over the structure, in accordance with one or more aspects of the present invention.

FIG. 8 depicts one example of the structure of FIG. 6 after filling the openings (126, FIG. 6) with an optical planarization layer (OPL) material 130 and creating a layer 132 of the OPL material over the structure, in accordance with one or more aspects of the present invention.

Figure 9:
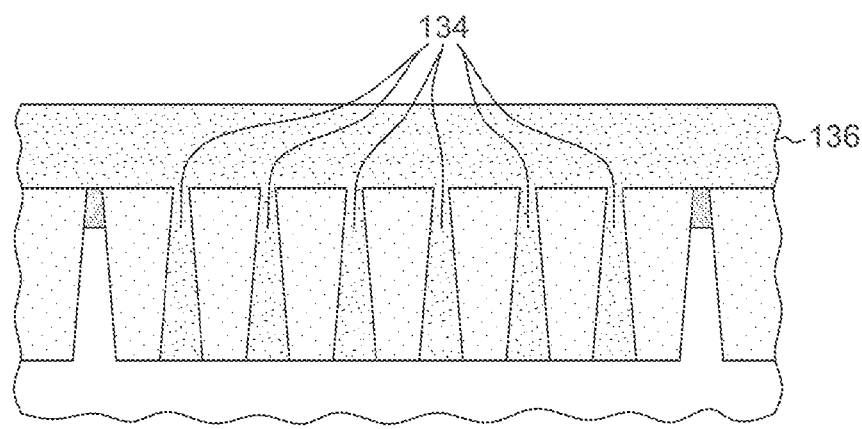
FIG. 9 depicts one example of the structure of FIG. 7 after filling the openings with an optical planarization layer (OPL) material and creating a layer of the OPL material over the structure, in accordance with one or more aspects of the present invention.

FIG. 9 depicts one example of the structure of FIG. 7 after filling the openings (128, FIG. 7) with an optical planarization layer (OPL) material 134 and creating a layer 136 of the OPL material over the structure, in accordance with one or more aspects of the present invention.

In one example, filling the openings with OPL material and creating the top OPL layer in either FIG. 8 or FIG. 9 may be accomplished using, for example, conventional processes and techniques (e.g., blanket deposition).

Figure 10:
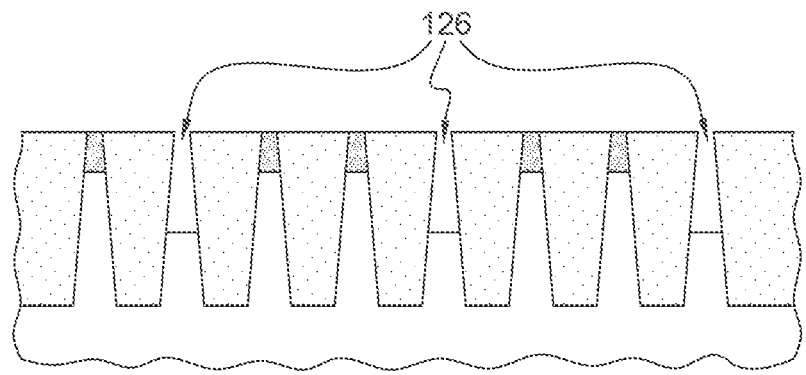
FIG. 10 depicts one example of the structure of FIG. 8 after removing the OPL material, the removing restoring the openings, in accordance with one or more aspects of the present invention.

FIG. 10 depicts one example of the structure of FIG. 8 after removing the OPL material, the removing restoring openings 126, in accordance with one or more aspects of the present invention.

Figure 11:
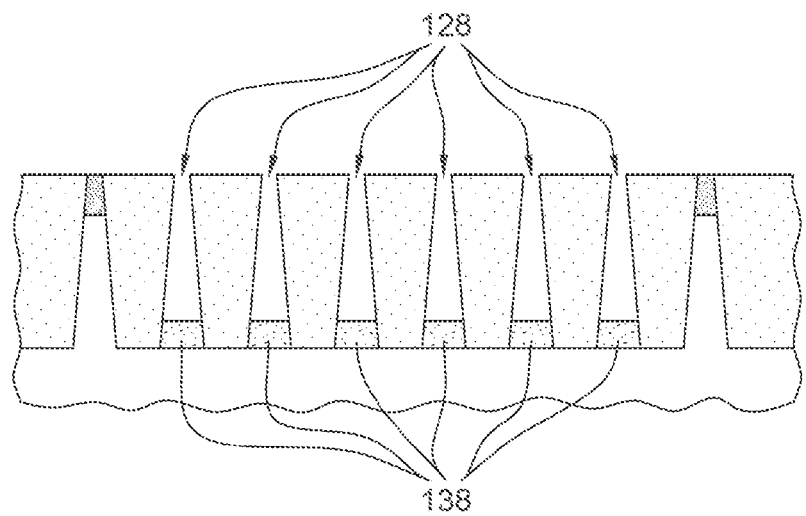
FIG. 11 depicts one example of the structure of FIG. 9 after partially recessing the OPL material, a portion of the OPL material remaining in the openings, in accordance with one or more aspects of the present invention.

FIG. 11 depicts one example of the structure of FIG. 9 after partially recessing the OPL material, a portion 138 of the OPL material remaining in the openings 128, in accordance with one or more aspects of the present invention.

In the case of either FIG. 10 or FIG. 11, removal/recessing the OPL material may be accomplished using, for example, conventional processes and techniques.

Figure 12:
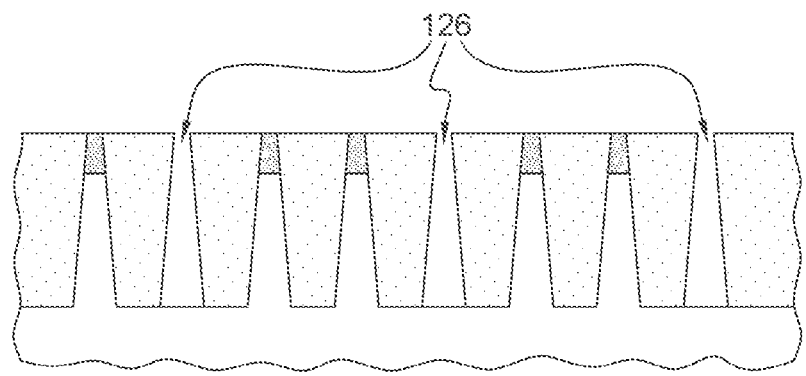
FIG. 12 depicts one example of the structure of FIG. 10 after removing a remainder of the individual raised structures, removing the remaining individual raised structures extending the openings, in accordance with one or more aspects of the present invention.

FIG. 12 depicts one example of the structure of FIG. 10 after removing a remainder of the individual raised structure(s) (e.g., raised structure 108 in FIG. 6), removing the remaining OPL material extending openings 126 down to the substrate, in accordance with one or more aspects of the present invention.

In one example, removing the remainder of the individual raised structures may be accomplished using, for example, an isotropic reactive ion etch process.

Figure 13:
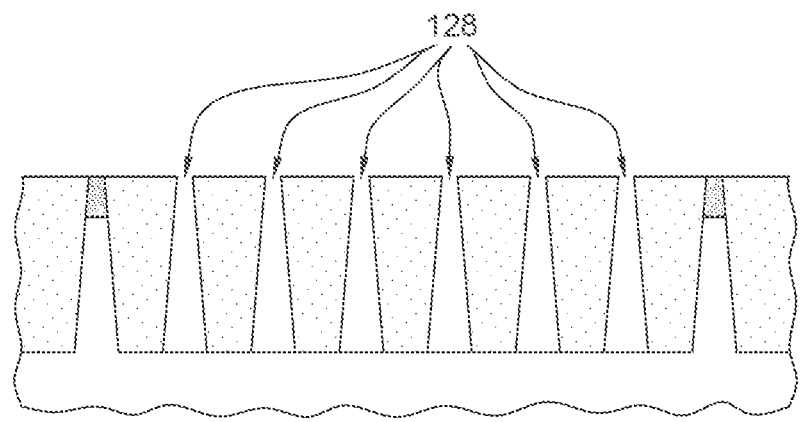
FIG. 13 depicts one example of the structure of FIG. 11 after removing the OPL material remaining in the openings, removing the remaining OPL extending the openings, in accordance with one or more aspects of the present invention.

FIG. 13 depicts one example of the structure of FIG. 11 after removing the OPL material remaining in the openings (138, FIG. 11), removing the remaining OPL material extending openings 128 down to the substrate, in accordance with one or more aspects of the present invention.

In one example, removing the remaining OPL material from the openings may be accomplished using a highly selective etch process.

In a first aspect, disclosed above is a method of uniform recessing of semiconductor structures raised with respect to the substrate (e.g., fins). The method includes providing a starting semiconductor structure, the structure including a semiconductor substrate, multiple raised semiconductor structures coupled to the substrate, each raised structure having a hard mask layer thereover and being surrounded by isolation material. The method further includes removing the hard mask layer over some of the raised structures, at least partially removing the some of the raised structures, the at least partially removing creating openings, and filling the openings with an optical planarization layer (OPL) material. As used herein, "some of the raised structures" means more than one and less than all of the raised structures.

In one example, the some of the raised structures may include, for example, at least two nonadjacent raised structures, and the at least partially removing may include partially removing the at least two nonadjacent raised structures.

In one example, the some of the raised structures of the first aspect may include, for example, at least two adjacent raised structures, and the at least partially removing may include fully removing the at least two adjacent raised structures.

In one example, the method of the first aspect may further include, for example, removing at least a portion of the OPL material, and removing any remaining portions of the some of the raised structures and the OPL material. Where these aspects are present, filling the openings in the first aspect may include, for example, also creating a layer of the OPL material over the structure.

In one example, the some of the raised structures may include, for example, at least two nonadjacent raised structures, and removing at least a portion of the OPL material may include removing the layer of OPL material over the structure, and partially removing the OPL material from the openings.

In another example, the some of the raised structures may include, for example, at least two adjacent raised structures, and removing at least a portion of the OPL material may include removing the layer of OPL material over the structure, and fully removing the OPL material from the openings.

In one example, removing the hard mask layer over some of the raised structures in the method of the first aspect may include, for example, masking a rest of the raised structures, removing the hard mask layer over the some of the raised structures, and unmasking the rest of the raised structures.

In a second aspect, disclosed above is a method. The method includes providing a starting semiconductor structure, the structure including a semiconductor substrate, raised semiconductor structures coupled to the substrate, each raised structure having a hard mask layer thereover and being surrounded by isolation material. The method further includes removing the hard mask layer over at least two nonadjacent raised structures, and partially removing the at least two nonadjacent raised structures, the partially removing creating openings. The method further includes filling the openings with an optical planarization layer (OPL) material and creating a layer of the OPL material over the structure, removing at least a portion of the OPL material, and removing any remaining portions of the at least two nonadjacent raised structures and the OPL material.

In one example, removing at least a portion of the OPL material may include, for example, removing the layer of OPL material over the structure, and partially removing the OPL material from the openings.

In one example, the method of the second aspect may further include, for example, masking a rest of the raised structures prior to the removing, and unmasking the rest of the raised structures after the partially removing and prior to filling the openings.

In a third aspect, disclosed above is a method. The method includes providing a starting semiconductor structure, the structure including a semiconductor substrate, raised semiconductor structures coupled to the substrate, each raised structure having a hard mask layer thereover and being surrounded by isolation material. The method further includes removing the hard mask layer over at least two adjacent raised structures, and fully removing the at least two adjacent raised structures, the fully removing creating openings. The method further includes filling the openings with an optical planarization layer (OPL) material and creating a layer of the OPL material over the structure, removing at least a portion of the OPL material, and removing any remaining portions of the at least two adjacent raised structures and the OPL material.

In one example, removing at least a portion of the OPL material may include, for example, removing the layer of OPL material over the structure, and fully removing the OPL material from the openings.

In one example, the method of the third aspect may further include, for example, masking a rest of the raised structures prior to the removing, and unmasking the rest of the raised structures after the fully removing and prior to filling the openings.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting semiconductor structure, the structure comprising a semiconductor substrate, a plurality of raised semiconductor structures coupled to the substrate, each raised structure having a hard mask layer thereover and being surrounded by isolation material;
removing the hard mask layer over some of the raised structures;
at least partially removing the some of the raised structures, the at least partially removing creating openings; and
filling the openings with an optical planarization layer (OPL) material.

2. The method of claim 1, wherein the some of the raised structures comprises at least two nonadjacent raised structures, and wherein the at least partially removing comprises partially removing the at least two nonadjacent raised structures.

3. The method of claim 1, wherein the some of the raised structures comprises at least two adjacent raised structures, and wherein the at least partially removing comprises fully removing the at least two adjacent raised structures.

4. The method of claim 1, further comprising:
removing at least a portion of the OPL material; and
removing any remaining portions of the some of the raised structures and the OPL material.

5. The method of claim 4, wherein filling the openings comprises also creating a layer of the OPL material over the structure.

6. The method of claim 5, wherein the some of the raised structures comprises at least two nonadjacent raised structures, and wherein removing at least a portion of the OPL material comprises:
removing the layer of OPL material over the structure; and
partially removing the OPL material from the openings.

7. The method of claim 5, wherein the some of the raised structures comprises at least two adjacent raised structures, and wherein removing at least a portion of the OPL material comprises:
removing the layer of OPL material over the structure; and
fully removing the OPL material from the openings.

8. The method of claim 1, wherein removing the hard mask layer over some of the raised structures comprises:
masking a rest of the plurality of raised structures;
removing the hard mask layer over some of the raised structures; and
unmasking the rest of the plurality of raised structures.

9. A method, comprising:
providing a starting semiconductor structure, the structure comprising a semiconductor substrate, a plurality of raised semiconductor structures coupled to the substrate, each raised structure having a hard mask layer thereover and being surrounded by isolation material;
removing the hard mask layer over at least two nonadjacent raised structures;
partially removing the at least two nonadjacent raised structures, the partially removing creating openings;
filling the openings with an optical planarization layer (OPL) material and creating a layer of the OPL material over the structure;
removing at least a portion of the OPL material; and
removing any remaining portions of the at least two nonadjacent raised structures and the OPL material.

10. The method of claim 9, wherein removing at least a portion of the OPL material comprises:
removing the layer of OPL material over the structure; and
partially removing the OPL material from the openings.

11. The method of claim 9, further comprising:
masking a rest of the raised structures prior to the removing; and
unmasking the rest of the raised structures after the partially removing and prior to filling the openings.

12. A method, comprising:
providing a starting semiconductor structure, the structure comprising a semiconductor substrate, a plurality of raised semiconductor structures coupled to the substrate, each raised structure having a hard mask layer thereover and being surrounded by isolation material;
removing the hard mask layer over at least two adjacent raised structures;
fully removing the at least two adjacent raised structures, the fully removing creating openings;
filling the openings with an optical planarization layer (OPL) material and creating a layer of the OPL material over the structure;
removing at least a portion of the OPL material; and
removing any remaining portions of the at least two adjacent raised structures and the OPL material.

13. The method of claim 12, wherein removing at least a portion of the OPL material comprises:
   removing the layer of OPL material over the structure; and
   fully removing the OPL material from the openings.

14. The method of claim 12, further comprising:
   masking a rest of the raised structures prior to the removing; and
   unmasking the rest of the raised structures after the fully removing and prior to filling the openings.

* * * * *